(12) United States Patent
Smith et al.

(10) Patent No.: US 9,983,304 B2
(45) Date of Patent: May 29, 2018

(54) DELTA-SIGMA DIGITAL RADIOMETRIC SYSTEM

(71) Applicant: NORTHROP GRUMMAN SYSTEMS CORPORATION, Falls Church, VA (US)

(72) Inventors: Andrew D. Smith, Rancho Palos Verdes, CA (US); Leland Gilreath, Newport Beach, CA (US); Khanh Thai, Huntington Beach, CA (US)

(73) Assignee: Northrop Grumman Systems Corporation, Falls Church, VA (US)

( * ) Notice: Subject to any disclaimer, the term of this patent is extended or adjusted under 35 U.S.C. 154(b) by 583 days.

(21) Appl. No.: 14/627,094

(22) Filed: Feb. 20, 2015

(65) Prior Publication Data
US 2016/0245912 A1    Aug. 25, 2016

(51) Int. Cl.
*G01S 3/02* (2006.01)
*G01S 13/89* (2006.01)
(Continued)

(52) U.S. Cl.
CPC .............. *G01S 13/89* (2013.01); *H03M 1/48* (2013.01); *H03M 1/182* (2013.01); *H03M 1/20* (2013.01); *H03M 1/365* (2013.01)

(58) Field of Classification Search
CPC .................................. G01S 13/89; H03M 1/48
(Continued)

(56) References Cited

U.S. PATENT DOCUMENTS

| 4,982,193 A | 1/1991 | Saul |
| 5,227,800 A | 7/1993 | Huguenin et al. |

(Continued)

FOREIGN PATENT DOCUMENTS

| EP | 0 284 957 A2 | 10/1988 | |
| EP | 0284957 A2 * | 10/1988 | .............. H03M 1/00 |
| GB | 2 144 285 A | 2/1985 | |

OTHER PUBLICATIONS 28.1 A programmable 0.7-to-2.7GHz direct ΔΣ receiver in 40nm CMOS; Englund et al. http://ieeexplore.ieee.org/document/6757517/.*

(Continued)

*Primary Examiner* — Chuong P Nguyen
(74) *Attorney, Agent, or Firm* — John A. Miller; Shumaker, Loop & Kendrick, LLP

(57) ABSTRACT

A passive radiometric system for thermally imaging objects in a scene. The system includes a digital square-law quantizer circuit including a plurality of comparators and a voltage divider network having a plurality of resistors. Each comparator receives a different reference signal generated by the voltage divider network and a common power signal from an antenna and outputs a high or low digital bit signal. The system also includes a delta-sigma circuit having a weighting table responsive to the digital bit signals from the comparators that converts the digital bit signals to a normalized bit word. The delta-sigma circuit also includes an accumulator that receives the digital bit words from the weighting table and provides an average of the digital bit words. The system also includes a digital-to-analog converter that converts the averaged bit words to an analog signal that is provided as a feedback signal to the quantizer circuit.

16 Claims, 2 Drawing Sheets

(51) Int. Cl.
  *H03M 1/48* (2006.01)
  *H03M 1/18* (2006.01)
  *H03M 1/20* (2006.01)
  *H03M 1/36* (2006.01)
(58) Field of Classification Search
  USPC ........................................................ 342/351
  See application file for complete search history.

(56) References Cited

U.S. PATENT DOCUMENTS

| | | | |
|---|---|---|---|
| 6,777,684 | B1 | 8/2004 | Volkov et al. |
| 6,880,262 | B1* | 4/2005 | Jensen ................. H03M 3/332 |
| | | | 341/120 |
| 6,946,644 | B2 | 9/2005 | Wood |
| 7,064,328 | B2 | 6/2006 | Bluzer |
| 7,522,274 | B2 | 4/2009 | Salmon |
| 7,603,088 | B2* | 10/2009 | Ammar ................ G01K 11/006 |
| | | | 324/76.14 |
| 7,737,876 | B2 | 6/2010 | Pavlov et al. |
| 7,889,113 | B2 | 2/2011 | Cardiasmenos et al. |
| 7,938,010 | B2 | 5/2011 | Villanucci et al. |
| 7,965,433 | B2* | 6/2011 | Smith ................... G02F 1/0123 |
| | | | 359/245 |
| 8,160,456 | B2* | 4/2012 | Smith ................... G02F 1/0123 |
| | | | 398/195 |
| 8,665,128 | B2 | 3/2014 | Silva et al. |
| 8,710,441 | B2 | 4/2014 | Bernacki et al. |
| 8,810,447 | B2 | 8/2014 | Huang et al. |
| 9,622,181 | B2* | 4/2017 | Talty ..................... H04B 1/3822 |
| 2006/0273255 | A1 | 12/2006 | Volkov et al. |
| 2008/0272951 | A1* | 11/2008 | Li Puma ............... H03M 1/129 |
| | | | 341/158 |
| 2010/0054757 | A1* | 3/2010 | Smith ................... G02F 1/0123 |
| | | | 398/198 |
| 2010/0140480 | A1* | 6/2010 | Rauer ................... G01F 23/288 |
| | | | 250/357.1 |
| 2012/0062411 | A1 | 3/2012 | Shylo et al. |
| 2015/0180496 | A1* | 6/2015 | Drago ................... H03M 1/462 |
| | | | 341/122 |
| 2016/0337979 | A1* | 11/2016 | Talty ..................... H04B 1/3822 |
| 2017/0163295 | A1* | 6/2017 | Talty ..................... H04B 1/0475 |

OTHER PUBLICATIONS

Mereni, Lorenzo, "Analyses and Design of 95-GHz SoC CMOS Radiometers for Passive Body Imaging" Analog Integr Circ Sig Process (2013) 77: pp. 373-383.

Lee, Alexander L., "Development and Fabrication of Low-Mass, Low-Power, Internally-Calibrated, MMIC-Based Millimeter-Wave Radiometers at 92 and 166 Ghz" Thesis, Spring 2012, 186 pgs.

Tomkins, Alexander, "A Passive W-Band Imaging Receiver in 65-nm Bulk CMOS" IEEE Journal of Solid-State Circuits, vol. 45, No. 10, Oct. 2010, pp. 1981-1991.

De Roo, Roger D., "The Iowa State University Direct Sampling L-Band Digital Radiometer" IEEE 2006, pp. 70-75.

Burrage, Derek M. "Optimizing Performance of a Microwave Salinity Mapper: Starrs L-Band Radiometer Enhancements" Journal of Atmospheric and Ocean Technology, vol. 25, Nov. 18, 2005, pp. 776-794.

Takasuka, Kaoru, "A Sigma-Delta Based Square-Law Compandor" IEEE, 1990, Custom Integrated Circuits Conference, pp. 12.7.1-12.7.4.

Ohlson, John E. "Digital Radiometer Performance" IEEE Transactions on Aerospace and Electronic Systems, vol. AES-9, No. 6, Nov. 1973, pp. 864-874.

\* cited by examiner

DELTA-SIGMA DIGITAL RADIOMETRIC SYSTEM

BACKGROUND

Field

This invention relates generally to a radiometric system for passively detecting and thermally imaging objects in a scene and, more particularly, to a radiometric system for passively detecting and thermally imaging objects in a scene, where the system employs a digital square-law quantizer and delta-sigma feedback integrated on a common chip using, for example, silicon-germanium (SiGe) and/or Si complementary metal oxide semiconductor (CMOS) fabrication technologies.

Discussion

Radiometric thermal imaging systems and cameras are known in the art that passively detect and process signals in certain frequency bands emitted from a particular scene. Some of these frequency bands, such as various RF bands in the 60-300 GHz frequency range, for example, 94 GHz (W-band), 140 GHz (D-band) and 220 GHz, are particularly useful because the emissions in those bands readily propagate through clouds, smoke, dust, fog, etc. Typically, the warmer or more emissive the object in the scene, the more energy the object emits at a particular frequency. The radiometric system will detect the RF energy and convert it to a representative temperature value so that the different objects in the scene can be separately imaged and identified. In order to be suitable and effective, these radiometric systems generally require detectors that have a high sensitivity, low drift and can handle large background temperatures.

A typical radiometric camera that detects and images radiation in the RF bands often includes a focal plane array (FPA) that converts the radiation into an electric signal, where a lens focuses the radiation onto the array. The FPA typically includes a configuration of a plurality of receivers positioned in a two-dimensional plane, where each of the receivers includes an antenna or signal horn having a pick-up probe at the front end that converts the radiation to an electrical signal that is amplified by a microwave monolithic integrated circuit (MMIC) low noise amplifier. A diode at the back end of the each receiver rectifies the amplified voltage signal to a DC signal, where the DC signal amplitude is representative of the power level of the received signal, which increases as the temperature of the object being imaged increases, and where power and temperature are proportional to each other. The DC voltage signal from each receiver is then digitized and converted to an image, where higher voltages are displayed as whiter areas in the image representing warmer objects with higher radiometric temperature.

One of the challenges associated with these types of radiometric cameras is providing a high enough thermal resolution between objects detected in the scene. For example, in a typical scene, many of the objects will be near room temperature, thus requiring significant temperature resolution to distinguish those objects from each other. The sensitivity of the radiometer system depends on the receive system noise temperature T, the captured radiometric bandwidth B and the integration time τ as follows where it is assumed that the detector does not contribute input-referred noise power, and that low frequency bias drift is not present.

$$\delta T = \frac{T_{Sys}}{\sqrt{B\tau}}.$$

It is desirable that the operation of the radiometric system be as immune from signal drift as possible as the temperature of the system itself changes. In order to overcome a significant portion of this analog drift, it is known in the art to provide digital radiometric systems where the received RF analog signal is converted to the digital domain as quickly as possible. However, there are advantages and disadvantages to providing different levels and degrees of analog circuitry and digital circuitry in these types of systems. For example, the antenna and amplifier capture signals over a wide range of frequencies B. Analog diodes can rectify an entire broad frequency range. However, these types of analog circuits that employ diodes and the like often times have unacceptable signal drift and noise, especially at lower frequencies. Further, diode detectors typically do not have enough nonlinearity and are inefficient. Also, known digital radiometric systems that may employ fast Fourier transform (FFT) or root mean square (RMS) operations that convert digital frequency signals to a representative temperature typically require significant calculation at high sampling and data rates.

DETAILED DESCRIPTION OF THE EMBODIMENTS

The following discussion of the embodiments of the invention directed to a passive digital radiometric thermal imaging system is merely exemplary in nature, and is in no way intended to limit the invention or its applications or uses. For example, although the discussion herein talks about the radiometric system detecting RF and millimeter wave signals, the invention has application for a wider signal range, such as into the terahertz (THz) frequency bands.

The present invention proposes a digital radiometric system for thermally imaging a scene by passively detecting RF energy emitted from the scene and converting that RF energy to a thermal image. Through advances in silicon-germanium (SiGe) and Si complementary metal oxide semiconductor (CMOS) fabrication technologies, effective digital circuits can be built and integrated on a single chip so that the RF signals can be effectively converted to representative thermal signals with high resolution and for higher frequency ranges. As will be discussed, the radiometric system of the invention employs square-law detection to convert the RF signals to a representative digital signal, which employs a feedback signal from a delta-sigma circuit, where the square-law detector and the delta-sigma circuit are fabricated on a common chip using SiGe and Si CMOS fabrication technologies. The digital front-end of the square-law detector minimizes drift in the receive signal as a result of temperature changes of the system, and provides the sensitivity required for high resolution. In one embodiment, the square-law detector provides high sensitivity, such as around 1 Kelvin, has low drift, such as under 100 PPM, and can handle large background and amplifier noise temperatures, equivalent to as much as 3000 Kelvin.

Figure 1:
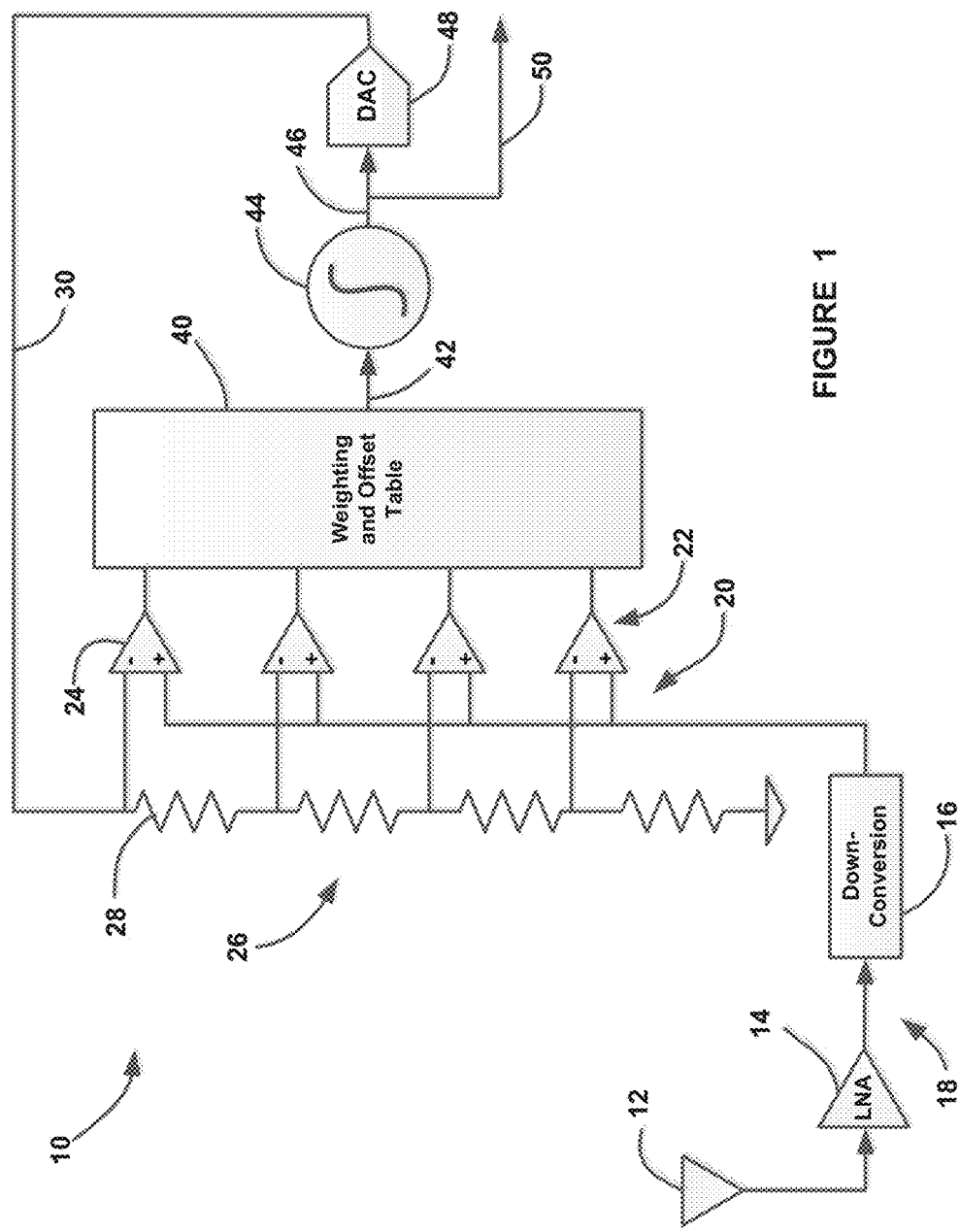
FIG. 1 is a schematic diagram of a digital radiometric receiver architecture employing digital square-law detection and delta-sigma feedback.

FIG. 1 is a schematic diagram of a receiver architecture 10 for a passive digital radiometric system. The architecture 10 includes an antenna 12 that accepts the RF radiation from a scene at the desired frequency band of interest, where the antenna 12 is configured and designed for that particular frequency band. Signals received by the antenna 12 are provided to a receiver front-end 18 where they are amplified by a low noise amplifier (LNA) 14 and then down-converted to an intermediate frequency by a down-conversion circuit 16 to convert the high frequency received by the antenna 12 to a lower frequency more suitable for operation by the digital circuitry of the architecture 10, as will be discussed below. For example, the antenna 12 may be designed to detect frequencies in the 90 GHz frequency band, and the circuit 16 may convert that frequency down to about 10 GHz, where the lower frequency still provides high resolution and a low enough frequency for operation of the digital circuitry. Employing the down-conversion circuit 16 would typically be design specific in that requiring such circuitry would depend on the frequency band being detected and the speed of the available digital electronics.

It is noted that the receiver architecture 10 and the antenna 12 may be one receiver architecture and antenna for one pixel of an array of many receiver architectures, where the antenna 12 may be part of a focal plane array (FPA). A typical FPA may include a configuration of a plurality of receivers positioned in a two-dimensional plane, where each of the receivers includes an antenna or signal horn having a pick-up probe. Alternately, the antenna 12 may be scanned across a scene through some scanning procedure, where the system only includes a single receiver architecture. It is also noted that for simplicity a unipolar circuit architecture is shown, which processes only radio signals above zero volts. One skilled in the art would have no difficulty constructing a bipolar equivalent handling both positive and negative threshold levels.

The down-converted RF signal from the receiver front-end 18 is sent to a square-law quantizer circuit 20 that converts the analog signal to a representative digital signal. The square-law quantizer circuit 20 includes a plurality of digital bit channels 22 each including a comparator 24 having a positive input and a negative input, where the RF signal from the receiver front-end 18 is provided to the positive input of each of the comparators 24, and where the output of each comparator 24 represents a digital bit that is part of a digital word identifying the power of the incoming RF signal at any particular sample point in time. More particularly, if the power of the RF signal at the positive input of the comparator 24 is higher than a reference voltage at the negative input of the comparator 24, then the output of the comparator 24 goes high representing a digital one bit, where otherwise the output of the comparator 24 is low representing a digital zero bit.

The square-law quantizer circuit 20 also includes a voltage divider network 26 having a resistor ladder 28. Each of the resistors 28 is weighted with a different resistive value, where in this non-limiting example, the lower resistor has the highest value and where the resistive value of the resistors 28 decreases towards the top of the resistor ladder 28. For example, in one non-limiting embodiment, the lowest of the resistors 28 may have an ohmic value of R, the second lowest of the resistors may have an ohmic value of 0.414 R, the next resistor 28 may have an ohmic value of 0.318 R, and the top resistor 28 may have an ohmic value of 0.268 R. A current flow provided on a feedback line 30 discussed in detail below flowing through the voltage divider network 26 provides a different voltage drop across each of the resistors. The negative input of each of the comparators 24 is coupled to a different location in the voltage divider network 26 so that a different potential is provided to the negative input of each of the comparators 24.

In this design, the negative input of the comparators 24 is coupled to the voltage divider network 26 so that the lower comparator 24 provides a logic one bit output for the lowest energy threshold level of the RF signal, the next comparator 24 provides a logic one bit output for a next increase in power level of the RF signal, the next comparator 24 provides a logic one bit output for a next increase in the power level of the RF signal and for the higher power RF signals, all of the comparators 24 will provide a logic one bit output. Although this embodiment includes four of the bit channels 22, this is by way of a non-limiting example in that the number of the channels 22 would be application specific. For example, an increase in the number of channels 22 may increase the bit resolution for a particular system, but increases the electronics required to process the signals, and at some point there is a diminishing level of return for noise reduction and resolution.

The digital bits from the square-law quantizer circuit 20 are sent to a weighting and offset table 40 that performs mathematical operations on the digital signal that then outputs the modified digital signal as a digital data stream on line 42. The weighting table 40 normalizes the digital word based on the outputs from the comparators 24 and the values of the resistors 22 so that the digital signal is a value that falls within a particular range, such as zero to 1. The digital data stream on the line 42 is sent to an accumulate and decimate circuit 44 that accumulates the weighted data bits over time and then divides the accumulated bits by the number of samples to provide an averaged digital signal representative of the temperature at any particular point in time, where the circuit 44 operates as a long term averaging filter. More particularly, the circuit 44 operates to filter out noise in the received RF signal at a particular point in time by averaging the temperature signal over time to remove the noise. By averaging many of the digital signals over time, the resolution of the detected power signal from the antenna 12 can be increased. In this way, for example, the square-law quantizer 20 processes billions of samples per second and the circuit 44 outputs thousands of samples per second to provide the relatively noise free resolution. The normalized digital signal from the circuit 44 provided on line 46 is the actual digital signal that is then converted to the thermal image, where that signal is provided on line 50 for subsequent image processing in a manner that would be well understood by those skilled in the art.

The weighting table 40 and the circuit 44 combine to operate as a delta-sigma circuit to provide a feedback signal on the line 30 to the voltage divider network 26 so that the voltage potential across the resistors 28 changes depending on the power of the signal being received at any particular point in time. In order to provide the feedback signal on the line 30, each digital signal that is output from the circuit 44 on the line 46 is converted to an analog signal by a digital-to-analog converter (DAC) 48. If the particular RF signal provided by the front-end 18 is at a higher end of the power range, then the feedback signal on the line 30 will change the voltage values applied to the negative input of the comparators 24 so that the output of the comparators 24 will not go high until a higher RF value is received, thus increasing the resolution of the system at the particular power level being received at any point in time. Thus, by changing the voltage values provided to the comparators 24 through the feedback line 30, the balance and ratio between the different comparators 24 is maintained over a wider input power range.

Figure 2:
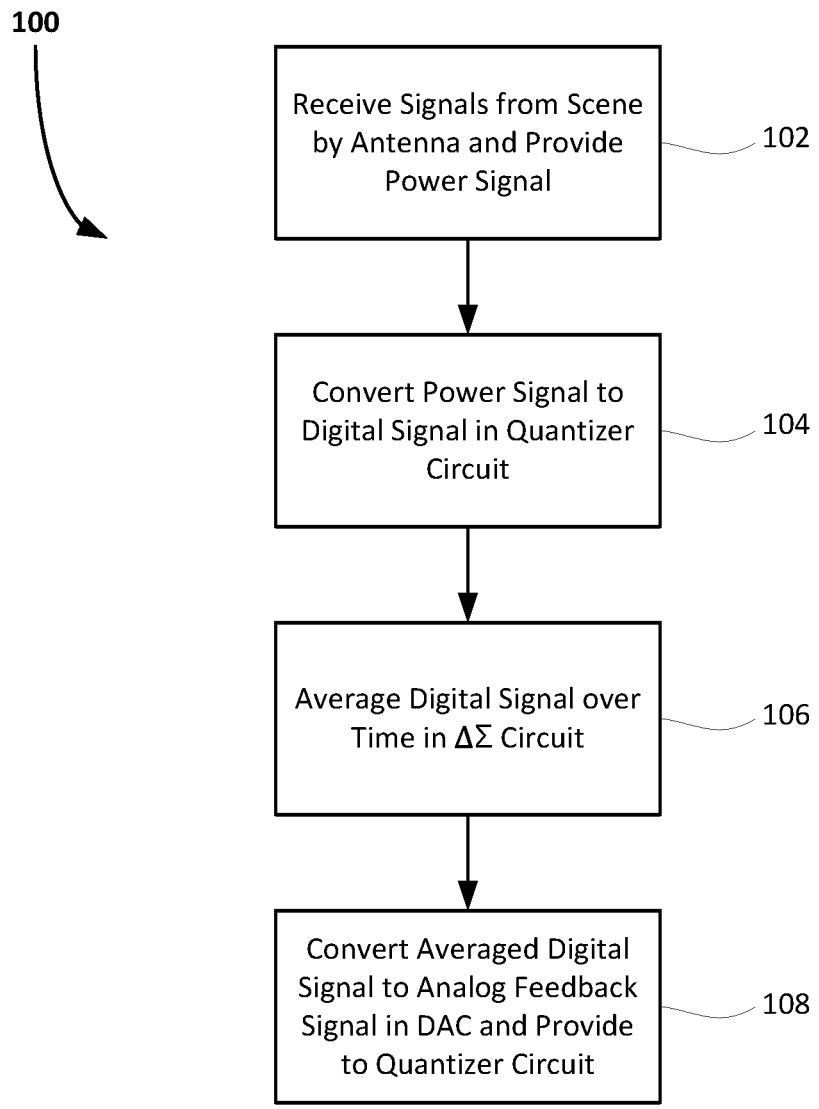
FIG. 2 is a flowchart diagram of a method for thermally imaging objects in a scene using digital square-law detection and delta-sigma feedback.

FIG. 2 is a flowchart diagram 100 of a method for thermally imaging objects in a scene using digital square-law detection and delta-sigma feedback. At box 102, the antenna 12 accepts RF radiation signals from a scene and provides a power signal to the front-end 18. At box 104, the power signal is converted to a digital signal in the square-law quantizer circuit 20 described above. At box 106, the digital signal from the comparators 24 in the quantizer circuit 20 is averaged over time in a delta-sigma circuit including the weighting table 40 and the accumulate and decimate circuit 44. The output of the circuit 44 is the temperature representation of the scene. At box 108, the averaged digital signal output from the circuit 44 is converted to an analog feedback signal in the DAC 48 and the feedback signal is provided to the quantizer circuit 20 as discussed earlier.

The foregoing discussion discloses and describes merely exemplary embodiments of the present invention. One skilled in the art will readily recognize from such discussion and from the accompanying drawings and claims that various changes, modifications and variations can be made therein without departing from the spirit and scope of the invention as defined in the following claims.

What is claimed is:

1. A passive radiometric system for thermally imaging objects in a scene, said system comprising:
   an antenna for receiving signals from the scene and providing a power signal;
   a digital square-law quantizer circuit including four comparators each having first and second inputs, said square-law quantizer circuit further including a voltage divider network having four weighted resistors and receiving an analog feedback signal, where each resistor in the voltage divider network has a different resistance value, and wherein each comparator receives a different voltage divided signal from the voltage divider network at the first input and the power signal from the antenna at the second input and outputs a high or low digital bit signal depending on whether the power signal is greater than or less than the voltage divided signal;
   a delta-sigma circuit including a weighting table responsive to the digital bit signals from the comparators, said weighting table normalizing the digital bit signals to a digital bit word having a value within a normalized range, said delta-sigma circuit further including an accumulate and decimate circuit receiving the digital bit words from the weighting table and accumulating the digital words over a predetermined sample time and dividing the accumulated digital bit words by a number of sample periods to provide an average of the digital word that is a temperature representation of the power signal; and
   a digital-to-analog converter (DAC) receiving the averaged digital bit word from the accumulate and decimate circuit and converting the averaged digital bit word to an analog signal provided as the feedback signal to the voltage divider network.

2. The system according to claim 1 wherein the digital square-law quantizer circuit and the delta-sigma circuit are fabricated in silicon-germanium (SiGe) or Si complementary metal oxide semiconductor (CMOS) fabrication technologies.

3. The system according to claim 2 wherein the square-law quantizer circuit and the delta-sigma circuit are integrated on a common chip.

4. The system according to claim 1 wherein the antenna is configured to receive signals in the RF band.

5. The system according to claim 4 wherein the RF band is the W-band (94 GHz) or D-band (140 GHz).

6. The system according to claim 1 further comprising a low noise amplifier (LNA) receiving the power signal from the antenna and amplifying the power signal.

7. The system according to claim 6 further comprising a down-converter circuit receiving the power signal from the LNA and down-converting the power signal before it is applied to the digital square-law quantizer circuit.

8. A passive radiometric system for thermally imaging objects in a scene, said system comprising:
   an antenna for receiving signals from the scene and providing a power signal;
   a digital square-law quantizer circuit responsive to the power signal from the antenna and an analog feedback signal, said quantizer circuit converting the power signal to a digital signal, wherein the digital square-law quantizer circuit includes a plurality of comparators each having first and second inputs, said square-law quantizer circuit further including a voltage divider network having a plurality of weighted resistors and receiving the analog feedback signal, where each resistor in the voltage divider network has a different resistance value, wherein each comparator receives a different voltage divided signal from the voltage divider network at the first input and the power signal from the antenna at the second input and outputs a high or low digital bit signal depending on whether the power signal is greater than or less than the voltage divided signal, and where the combination of the digital bits from the comparators is the digital signal from the quantizer circuit;
   a delta-sigma circuit responsive to the digital signals from the quantizer circuit, said delta-sigma circuit including a time-averaging device for removing signal noise by providing an average over time of the digital signals that is a temperature representation of the power signal; and
   a digital-to-analog converter (DAC) receiving the averaged digital signal from the delta-sigma circuit and converting the averaged digital signal to an analog signal provided as the feedback signal to the quantizer circuit.

9. The system according to claim 8 wherein the delta-sigma circuit includes a weighting table responsive to the digital bit signals from the quantizer circuit, said weighting table normalizing the digital bit signals to a digital bit word having a value within a normalized range, said delta-sigma circuit further including an accumulate and decimate circuit receiving the digital bit words from the weighting table and accumulating the digital words over a predetermined sample time and dividing the accumulated digital bit words by a number of sample periods to provide the average of the digital signals.

10. The system according to claim 8 wherein the digital square-law quantizer circuit and the delta-sigma circuit are fabricated in silicon-germanium (SiGe) or Si complementary metal oxide semiconductor (CMOS) fabrication technologies.

11. The system according to claim 10 wherein the square-law quantizer circuit and the delta-sigma circuit are integrated on a common chip.

12. The system according to claim 8 wherein the antenna is configured to receive signals in the RF band.

13. The system according to claim 12 wherein the RF band is the W-band (94 GHz) or D-band (140 GHz).

14. A method for thermally imaging objects in a scene, said method comprising:

providing an antenna for receiving signals from the scene and accepting a power signal;

converting the power signal to a digital signal in a digital square-law quantizer circuit using an analog feedback signal, wherein converting the power signal to a digital signal in a digital square-law quantizer circuit includes providing a plurality of comparators each having first and second inputs, and providing a voltage divider network having a plurality of weighted resistors that receive the analog feedback signal, where each resistor in the voltage divider network has a different resistance value, wherein each comparator receives a different voltage divided signal from the voltage divider network at the first input and the power signal from the antenna at the second input and outputs a high or low digital bit signal depending on whether the power signal is greater than or less than the voltage divided signal, where the combination of the digital bits from the comparators is the digital signal from the quantizer circuit;

averaging the digital signal over time in a delta-sigma circuit to generate an averaged digital signal that is a temperature representation of the power signal; and converting the averaged digital signal to the analog feedback signal in a digital-to-analog converter (DAC) and providing the feedback signal to the quantizer circuit.

15. The method according to claim 14 wherein averaging the digital signal over time in a delta-sigma circuit includes providing a weighting table responsive to the digital bit signals from the quantizer circuit, said weighting table normalizing the digital bit signals to a digital bit word having a value within a normalized range, providing an accumulate and decimate circuit receiving the digital bit words from the weighting table and accumulating the digital words over a predetermined sample time and dividing the accumulated digital bit words by a number of sample periods to provide the averaged digital signals.

16. The method according to claim 14 wherein the digital square-law quantizer circuit and the delta-sigma circuit are fabricated in silicon-germanium (SiGe) or Si complementary metal oxide semiconductor (CMOS) fabrication technologies on a common chip.

* * * * *